United States Patent
Yoon et al.

(10) Patent No.: US 7,008,306 B2
(45) Date of Patent: Mar. 7, 2006

(54) NOZZLE FOR INJECTING SUBLIMABLE SOLID PARTICLES ENTRAINED IN GAS FOR CLEANING A SURFACE

(75) Inventors: Cheol-Nam Yoon, Kyonggi-do (KR); Se-Jong Ko, Kyonggi-do (KR)

(73) Assignee: K.C. Tech Co., Ltd., (KR)

( * ) Notice: Subject to any disclaimer, the term of this patent is extended or adjusted under 35 U.S.C. 154(b) by 0 days.

(21) Appl. No.: 10/469,109

(22) PCT Filed: Feb. 28, 2002

(86) PCT No.: PCT/KR02/00348

§ 371 (c)(1), (2), (4) Date: Feb. 16, 2004

(87) PCT Pub. No.: WO02/075799

PCT Pub. Date: Sep. 26, 2002

(65) Prior Publication Data
US 2005/0277370 A1  Dec. 15, 2005

(30) Foreign Application Priority Data
Feb. 28, 2001 (KR) .............................. 2001-10240

(51) Int. Cl.
*B24C 5/04* (2006.01)

(52) U.S. Cl. .................. 451/102; 239/318; 239/433; 134/144; 134/902

(58) Field of Classification Search .............. 451/102, 451/99, 75; 239/398, 433, 318; 134/144, 134/95.3, 902
See application file for complete search history.

(56) References Cited

U.S. PATENT DOCUMENTS

| | | | |
|---|---|---|---|
| 4,478,368 A * | 10/1984 | Yie | 451/102 |
| 5,054,249 A * | 10/1991 | Rankin | 451/99 |
| 5,125,979 A | 6/1992 | Swain et al. | |
| 5,390,450 A | 2/1995 | Goenka | |
| 5,616,067 A | 4/1997 | Goenka | |
| 5,846,338 A | 12/1998 | Bonora et al. | |
| 6,168,503 B1 | 1/2001 | Pao et al. | |
| 6,390,899 B1 * | 5/2002 | Loubeyre | 451/102 |
| 6,695,686 B1 * | 2/2004 | Frohlich et al. | 451/102 |

OTHER PUBLICATIONS

International Search Report—PCT/KR02/00348; ISA/KR; Date of Mailing: Jun. 22, 2002.

* cited by examiner

*Primary Examiner*—Hadi Shakeri
(74) *Attorney, Agent, or Firm*—Harness, Dickey & Pierce, P.L.C.

(57) ABSTRACT

Disclosed is a nozzle for injecting sublimable solid particles, which is capable of minimizing consumption of the carrier gas and also maximizing cleaning efficiency. The nozzle comprises a base block having a space in which carrier gas is supplied through a gas supplying pipe; a sub-block having a space in which cleaning medium decompressed by a regulator is supplied through a cleaning medium supplying pipe; a first venturi block having a venturi path for adiabatically expanding the carrier gas supplied from the space of the base block, and a cleaning medium injection path communicating the venturi path and the space of the sub-block and the carrier gas passed through the venturi path; and a second venturi block having a venturi path for adiabatically expanding the mixed gas of the carrier gas and the cleaning medium.

8 Claims, 7 Drawing Sheets

FIG.1

PRIOR ART

FIG.2

PRIOR ART

FIG.3

PRIOR ART

NOZZLE FOR INJECTING SUBLIMABLE SOLID PARTICLES ENTRAINED IN GAS FOR CLEANING A SURFACE

TECHNICAL FIELD

The present invention relates to a nozzle for injecting sublimable solid particles such as $Co_2$ snow, Ar snow, etc., to clean a surface of a wafer or FPD (Flat Panel Display) and the like.

BACKGROUND ART

In order to clean pollutants such as fine particles on a surface of a wafer, an LCD, a color filter or various glass substrates, there has been proposed various techniques. Particularly, in the semiconductor industry, high-pressure liquid is used independently or used in a state of being combined with brushes to remove the polluted fine particles from a surface of a semiconductor wafer. These processes achieved partial success in removing the pollutant. However, the brushes scratch the surface of the substrate, and also it may generate undesirable static electricity. And, the high-pressure liquid is apt to cut the soft surface of the substrate. Further, the high-pressure liquid has a drawback that it is not easy to withdraw the liquid from the brushes and high-pressure liquid cleaning system.

Meanwhile, it is well known that solid and gas phase carbon dioxide ($CO_2$ snow) can remove the polluted fine particles from the surface of the substrate without the above-mentioned drawback. One of the techniques is disclosed in U.S. Pat. No. 5,125,979.

In the above mentioned technique, there are provided a small expansion chamber and a large expansion chamber which are communicated with each other through a venturi interposed therebetween. At an outlet of the large expansion chamber is provided an accelerating chamber for accelerating an injecting speed of a cleaning medium. The cleaning medium is supplied from a cleaning medium supplying source to the small expansion chamber, and then adiabatically expanded while being supplied through the venturi to the large expansion chamber, thereby forming $Co_2$ snow having snow particles of about 46%. The $Co_2$ snow is accelerated by inert gas introduced to the accelerating chamber, and then injected through a nozzle to a desired position in which the cleaning process is performed.

That is, in the technique, the cleaning medium is transformed into the $Co_2$ snow, while passing through the venturi. Then, the particles of the $Co_2$ snow grow, while the $Co_2$ snow passes through the large expansion chamber. The cleaning medium injected through the nozzle cleans the pollutant on the surface of the substrate and then sublimed.

However, in the technique, since the cleaning medium of $Co_2$ is transformed into the $Co_2$ snow, while passing through one venturi, a solidification rate of the cleaning medium is low. Furthermore, since the cleaning process is typically performed at a high presser, there is a problem that a large quantity of cleaning medium is needed to remove the polluted fine particles under the same conditions.

To solve the problem, the applicant had proposed Korean Patent application No. 2000-8560 filed on Feb. 22, 2000, entitled "Nozzle for cleaning components of semiconductor fabricating equipment".

Figure 1:
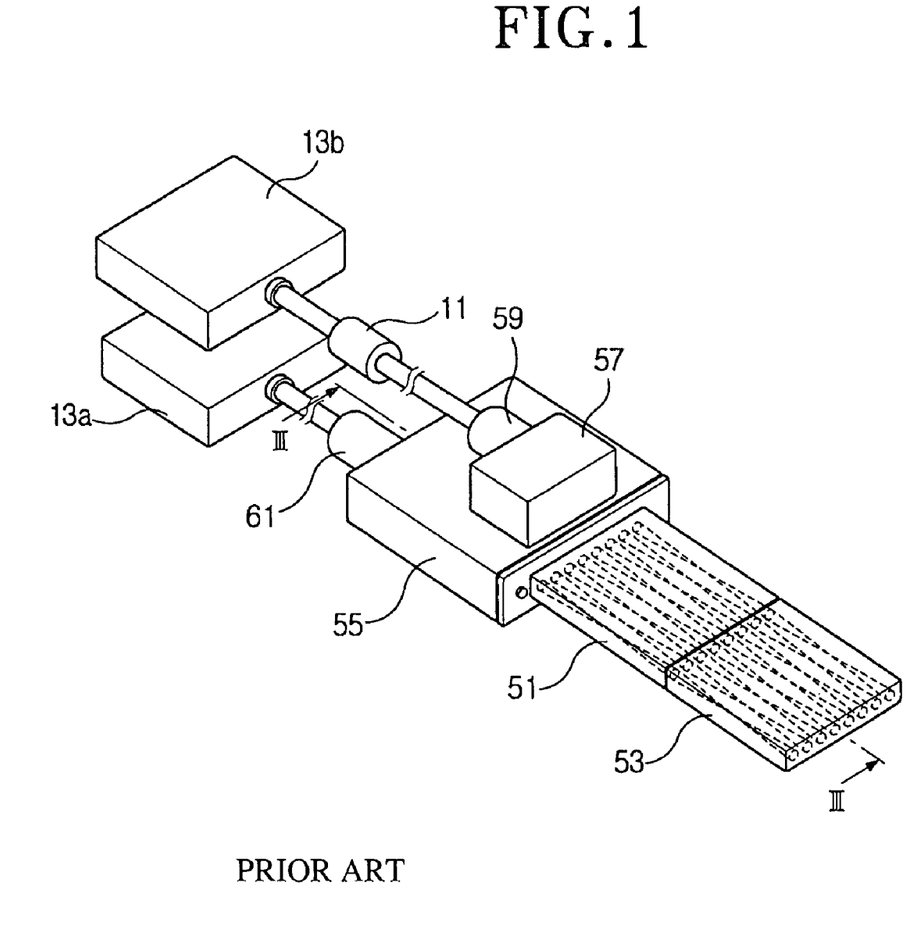
FIG. 1 is a perspective view a conventional nozzle for cleaning a component of a semiconductor.
Figure 2:
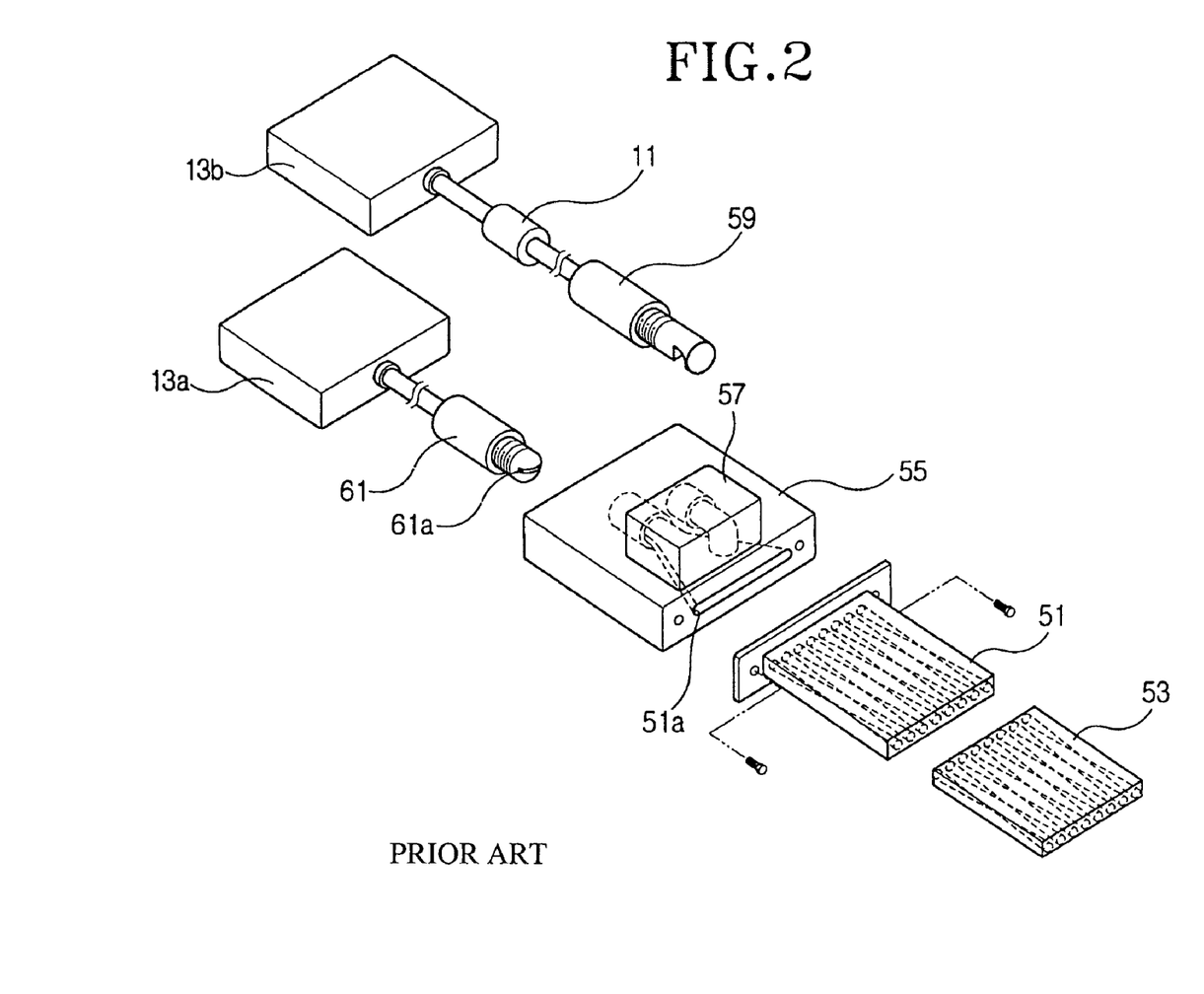
FIG. 2 is an exploded perspective view of the nozzle of FIG. 1.
Figure 3:
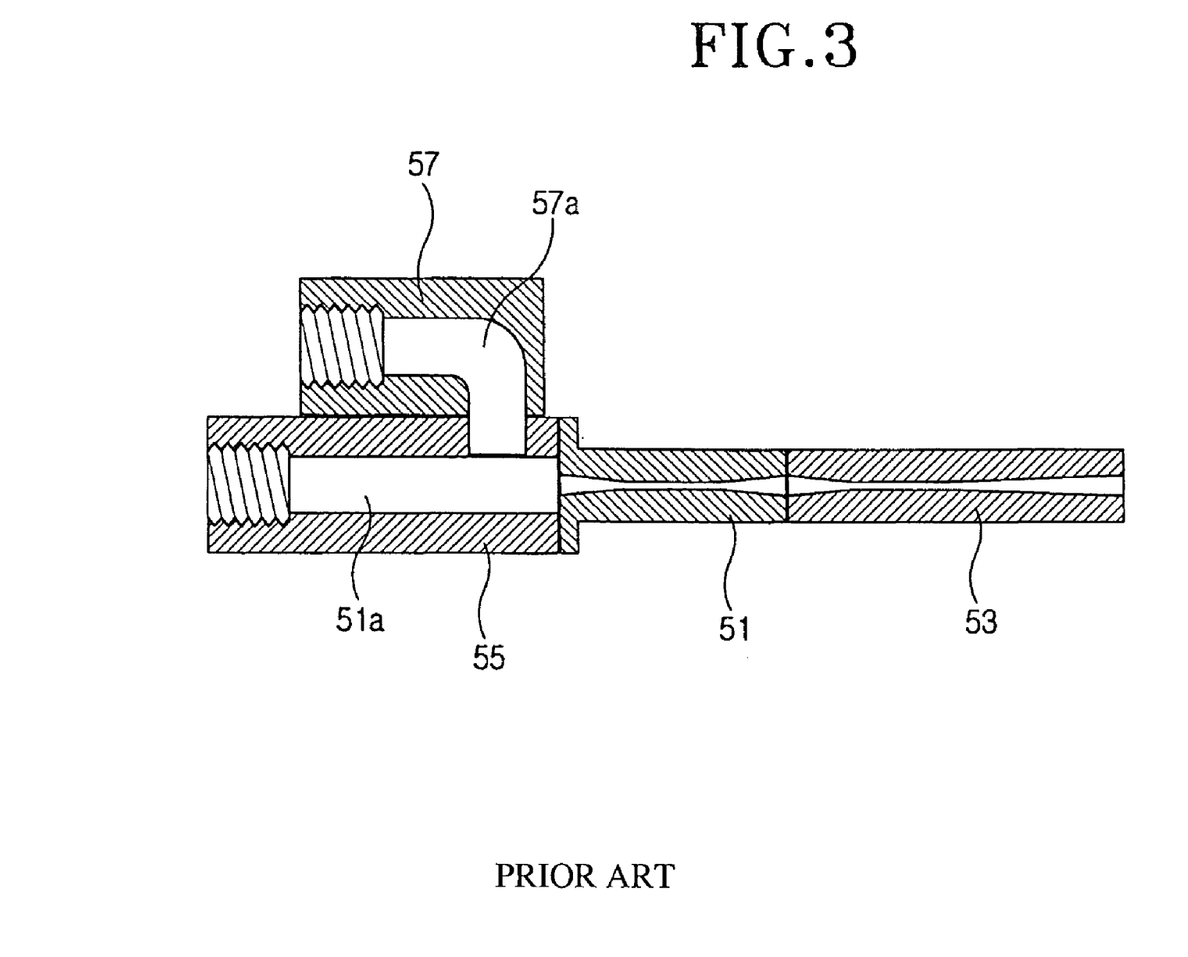
FIG. 3 is a cross-sectional view taken along the line III—III of FIG. 1.

As shown in FIGS. 1 to 3, the nozzle for cleaning components of a semiconductor fabricating equipment has first and second venturi blocks 51 and 53, which are disposed in series, to provide a wider cleaning surface than a single nozzle, thereby maximizing the cleaning efficiency. A carrier gas supplying pipe 61 is connected to a base block 55 in which the first venturi block 51 is disposed. A cleaning medium supplying pipe 59 is connected to a sub-block 57 disposed at an upper side of the base block 55.

The cleaning medium supplying pipe 59 is connected to a cleaning medium chamber 13b in which high-pressure $Co_2$ is stored in liquid phase. The cleaning medium supplying pipe 59 is controlled by a regulator 11 to have a lower pressure of 100~120 psi. Since the cleaning medium of $Co_2$ is reduced from the high pressure to the low pressure, the particles of snow state are formed in the cleaning medium. The cleaning medium controlled to have the above-mentioned pressure is supplied through the cleaning medium supplying pipe 59 and the sub-block 57 to a fan-shaped space 51a formed in the base block 55.

The carrier gas supplying pipe 61 is connected to a carrier gas chamber 13a to supply carrier gas such as $N_2$ to the base block 55. The carrier gas is stored in the carrier gas chamber 13a at a high pressure. As shown in FIG. 2, at an distal end of the carrier gas supplying pipe 61, there is formed a slot 61a for uniformly injecting the carrier gas into a plurality of venturi paths formed at the first venturi block 51. At the sub-block 57, there is formed a path 57a perpendicular to the fan-shaped space 51a to be communicated with the space 51a. The cleaning medium supplying pipe 59 has a circular portion on which the cleaning medium is dashed, so that the cleaning medium is uniformly injected into the fan-shaped space 51a.

Accordingly, the cleaning medium supplied through the cleaning medium supplying pipe 59 to the space 51a of the base block 55 is mixed with the carrier gas injected from the carrier gas supplying pipe 61 in the space 51a so as to firstly induce the solidification of the cleaning medium. The mixed gas is adiabatically expanded, while passing through the venturi paths formed in the first venturi block 51, whereby a temperature and a pressure of the mixed gas are sharply reduced. Since the cleaning medium is adiabatically expanded in the first venturi block 51, the solidification of the cleaning medium is further promoted. Further, the cleaning medium is adiabatically expanded again, while passing through the second venturi block 53, and thus, the solidification of the cleaning medium is promoted once more. However, the conventional technique as described above has a structure that the cleaning medium supplying path is perpendicular to the carrier gas supplying path at a place where the cleaning medium and the carrier gas is mixed. Therefore, since the carrier gas having the higher pressure than the cleaning medium is flowed back to the cleaning medium supplying path, there is a problem that the cleaning medium supplying path is clogged. Furthermore, since the carrier gas is supplied at the high pressure, there is another problem that the consumption of the carrier gas is increased.

DISCLOSURE OF THE INVENTION

Therefore, an object of the present invention is to provide a nozzle for injecting sublimable solid particles, which is capable of preventing the clogging of the cleaning medium supplying path due to backflow of carrier gas, and also minimizing consumption of the carrier gas.

Another object of the present invention is to provide a nozzle for injecting sublimable solid particles, in which a desired staying space for carrier gas and cleaning medium is secured at a place that the carrier gas and the cleaning medium are mixed, thereby uniformly mixing the carrier gas and the cleaning medium, and which stabilizes growth of particles and flow of the carrier gas and the cleaning medium to maximize solidification of the cleaning medium, thereby improving cleaning efficiency.

The present invention provides nozzle for injecting sublimable solid particles entrained in gas for cleaning a surface, comprising a base block having a space in which carrier gas is supplied through a gas supplying pipe; a sub-block having a space in which cleaning medium decompressed by a regulator is supplied through a cleaning medium supplying pipe; a first venturi block having a venturi path for adiabatically expanding the carrier gas supplied from the space of the base block, and a cleaning medium injection path communicating the venturi path and the space of the sub-block to mix the cleaning medium of the sub-block and the carrier gas passed through the venturi path; and a second venturi block having a venturi path for adiabatically expanding the mixed gas of the carrier gas and the cleaning medium, wherein the venturi path of the first venturi block has an acute angle with respect to the cleaning medium injection path.

The nozzle of the present invention comprises an intermediate block having a path, which is disposed between the first and second venturi blocks, for promoting the mixture of the carrier gas and the cleaning medium in the mixed gas moving from the path of the first venturi block to the path of the second venturi block and thus inducing growth of snow particles.

Herein, the first and second venturi blocks respectively have a plurality of venturi paths disposed in parallel, and the sub-block has the same number of cleaning medium injection paths as the number of venturi paths.

Further, the venturi path of the first venturi block has an angle of 15 to 60° with respect to the cleaning medium injection path. Therefore, it is prevented that the carrier gas is flowed back to the cleaning medium injection path. More preferably, the injection hole in which the cleaning medium decompressed by the regulator is mixed with the carrier gas has a diameter of 0.1 to 0.3 mm. Therefore, since the pressure of the cleaning medium injected through the injection path is higher than that of the carrier gas, it is efficiently prevented that the carrier gas is flowed back.

the carrier gas supplying pipe has a slit at an end thereof so that the carrier gas is injected at a desired angle range when supplied to the space of the base block. The carrier gas injected through the slit has an angle of 116°.

further, the cleaning medium supplied to the first venturi path has a pressure of 10 to 50 psi, and the carrier gas supplied to the space of the base block has a pressure of 60 to 100 psi.

The cleaning medium is $Co_2^+$ or $Ar^+$, and the carrier gas is $N_2$ gas or clean dry air.

BEST MODE FOR CARRYING OUT THE INVENTION

The present invention will now be described in further detail with reference to the drawings.

Figure 4:
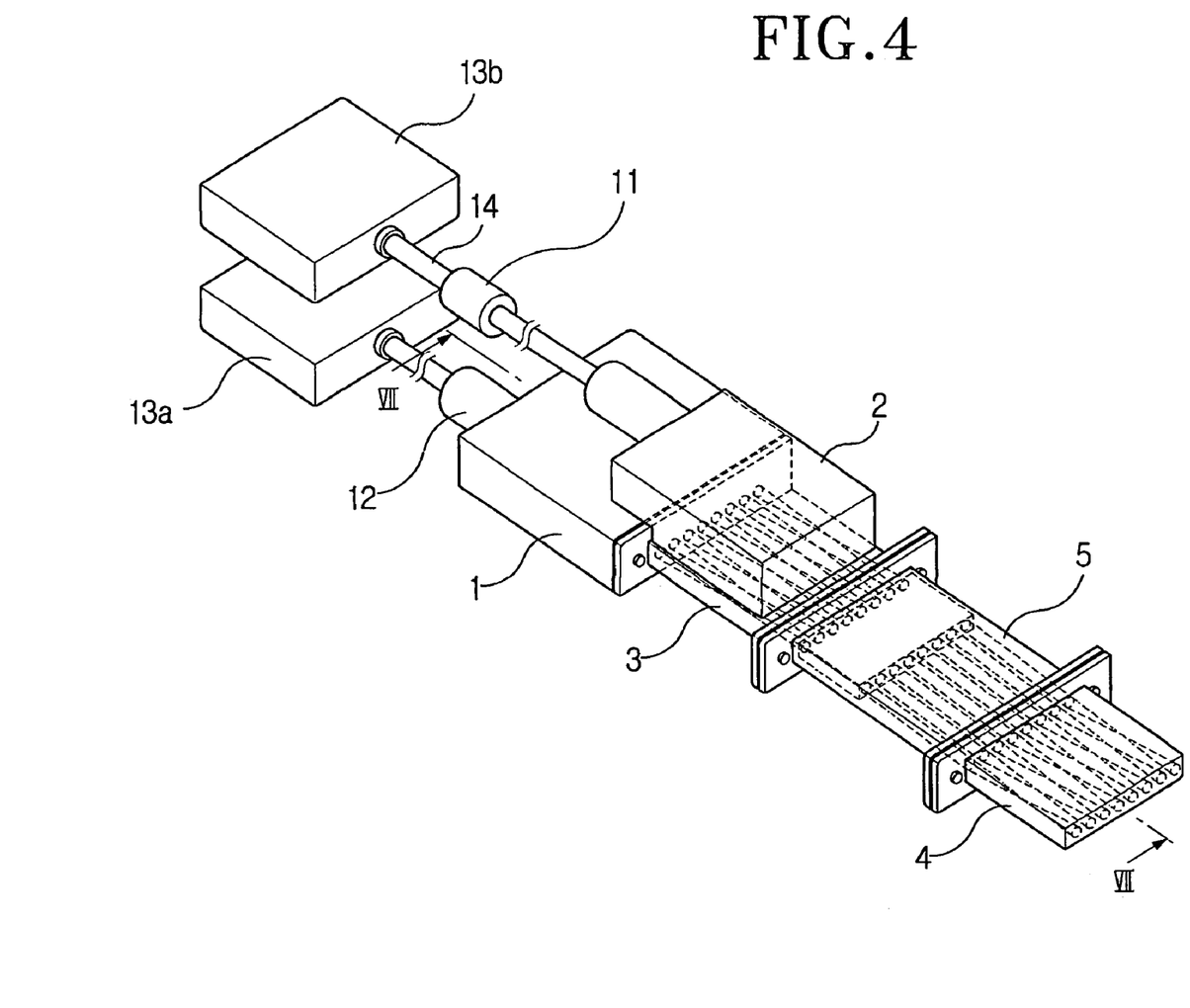
FIG. 4 is a perspective view of a nozzle for injecting sublimable solid particles entrained in gas for cleaning a surface according to the present invention.
Figure 5:
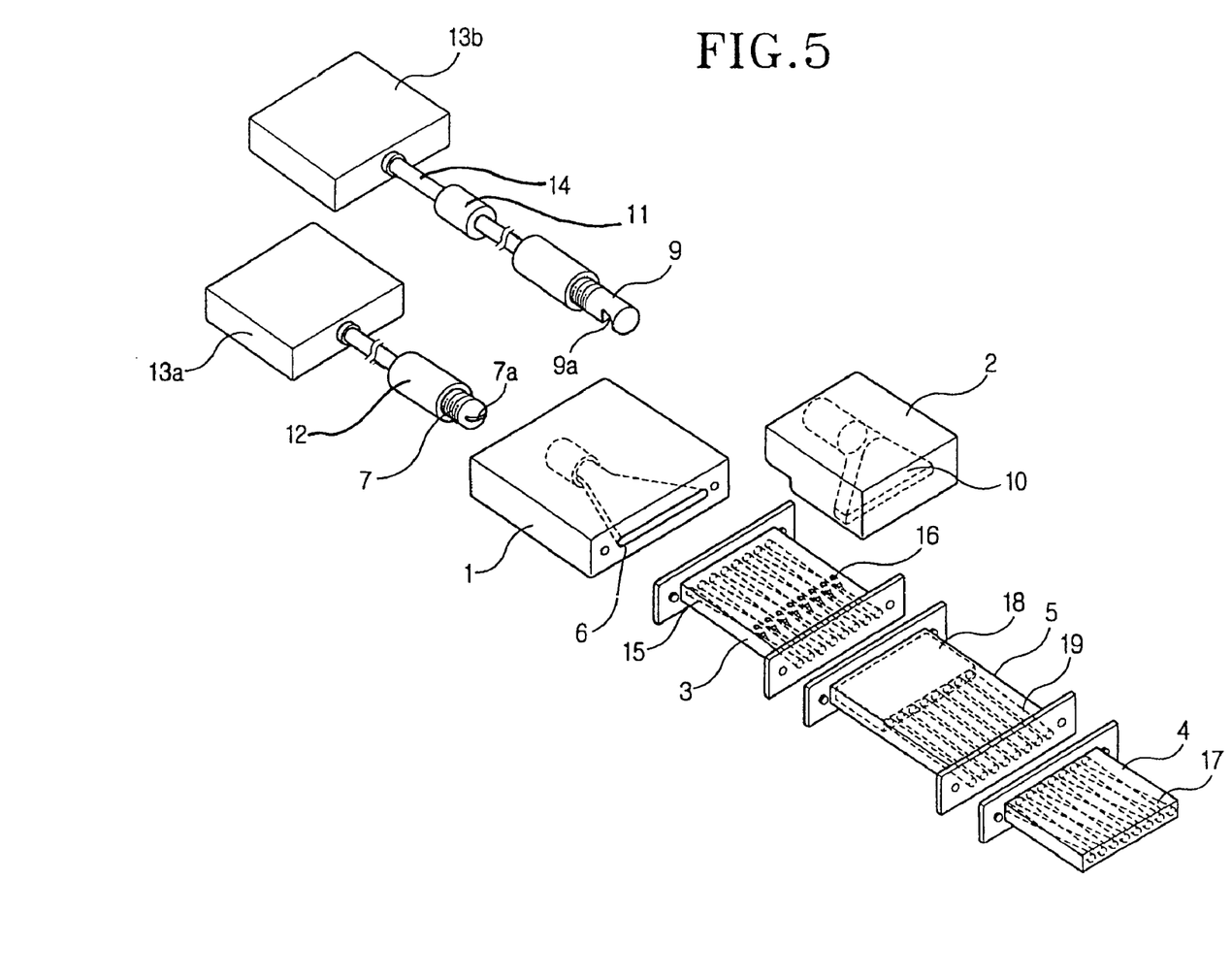
FIG. 5 is an exploded perspective view of the nozzle of FIG. 4.

As shown in FIGS. 4 and 5, a nozzle according to the present invention includes a base block 1, a sub-block 2, a first venturi block 3 and a second venturi block 4. A intermediate block 5 may be disposed between the first and second venturi blocks 3 and 4. The intermediate block 5 has a mixing space for assuring mixture of cleaning medium and carrier gas and stabilizing flow of the cleaning medium and carrier gas.

Figure 6:
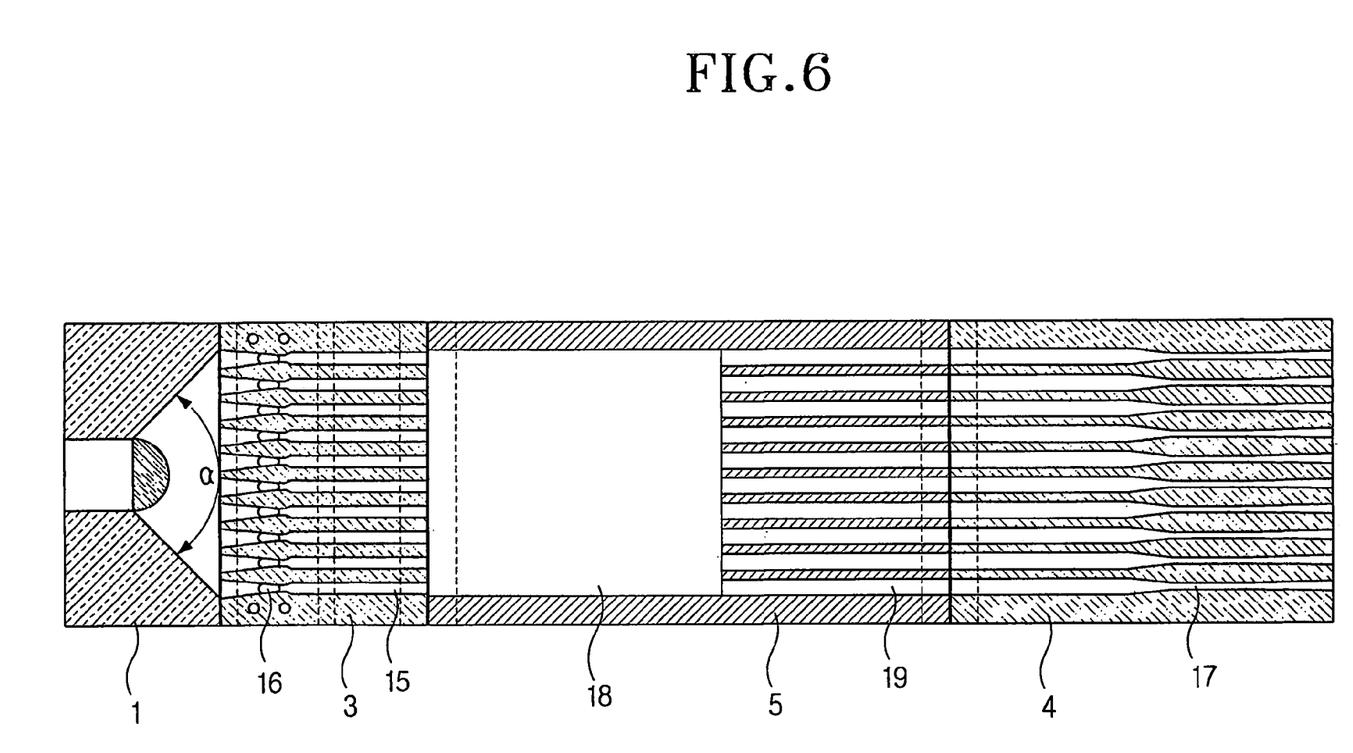
FIG. 6 is a plan view of the nozzle in which a sub-block is removed according to the present invention.

The base block 1 is connected through a carrier gas supplying pipe 12 to a carrier gas chamber 13a in which carrier gas such as $N_2$ gas or clean dryd air. The carrier gas supplied to the base block 1 typically has a pressure of 60 to 100 psi. The carrier gas supplying pipe 12 has a nozzle body 7 at an end thereof. As shown in FIG. 5, the nozzle body 7 is disposed at the base block 1 so as to inject the carrier gas into a space 6 formed in the base block 1. The nozzle body-7 is formed with a slit 7a for injecting the carrier gas at an injecting angle a of about 116° into the space of the base block 1. As shown in FIG. 6, the space 6 formed in the base block 1 is formed into a sector having an angle of 116°.

The sub-block 2 is positioned at an upper side of the base block 1 to be connected to the first venturi block 3. The sub-block 2 is connected through a cleaning medium supplying pipe 14 to a $Co_2$ cleaning medium chamber 13b in which cleaning medium for generating solidifying particles like $Co_2$ particles. When the cleaning medium is injected through a nozzle body 9, which is disposed at an end of the cleaning medium supplying pipe 14, to an injection space 10, the cleaning medium is firstly decompressed to a pressure of about 10 to 50 psi by a regulator 11 or other valve means disposed at the cleaning medium supplying pipe 14 and then injected into the injection space 10 of the sub-block 2 in a liquid $C0_2$ state.

Meanwhile, a cryogenic heat exchanger (not shown) is disposed between the cleaning medium chamber 13b and the regulator 11. Therefore, the cleaning medium of $Co_2$ gas is transformed into liquid $Co_2$ due to temperature drop while passing through the cryogenic heat exchanger, and transformed again into liquid $Co_2$ having a lower pressure while passing through the regulator 11, and then introduced into the sub-block 2. Solidified particles like $Co_2$ particles is generated at a place where the cleaning medium is mixed with the carrier gas.

Figure 7:
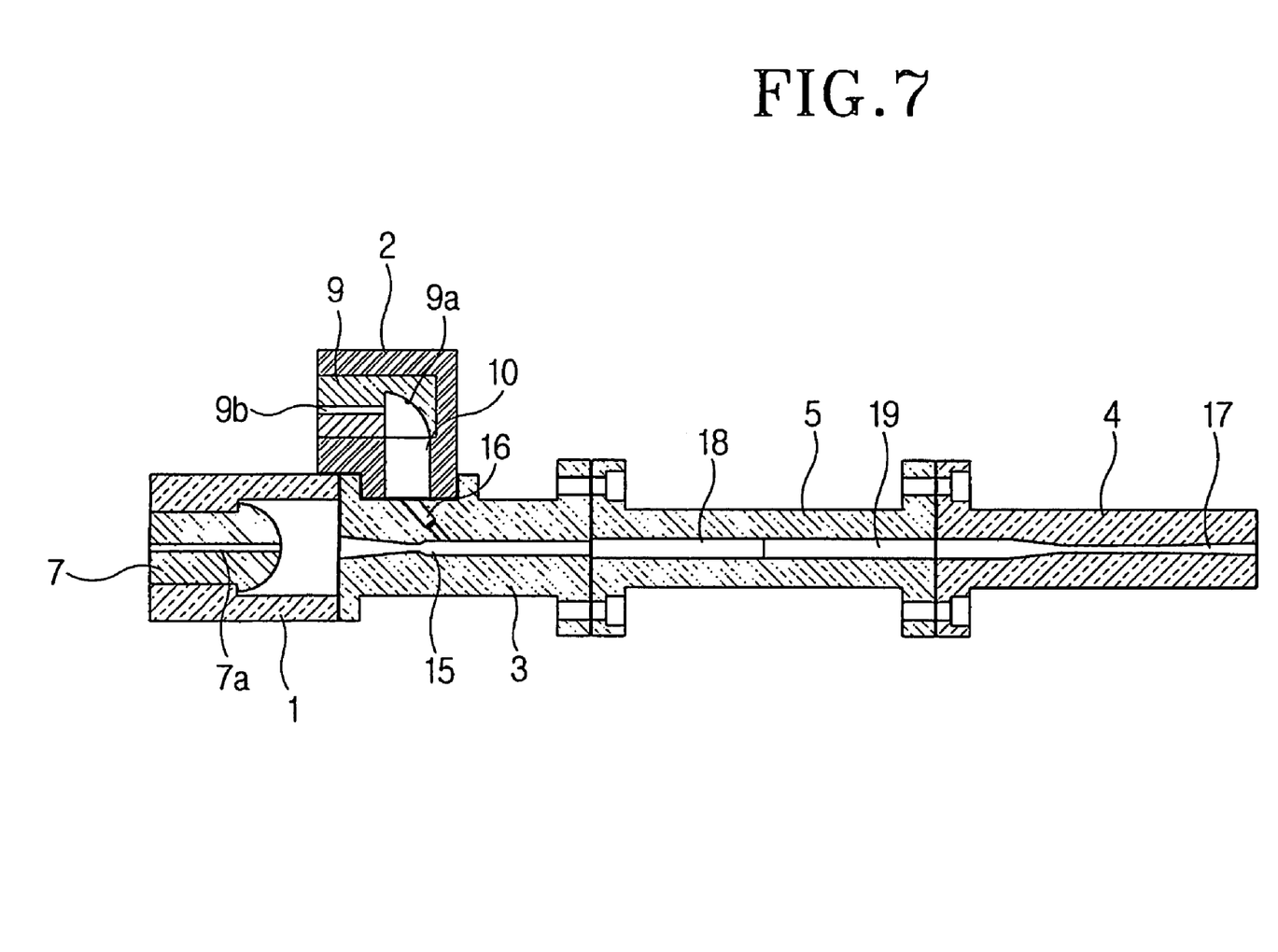
FIG. 7 is a cross-sectional view taken along the line VII—VII of FIG. 4.

As shown in FIGS. 5 and 7, the injection space 10 of the sub-block 2 is formed into the sector, and disposed to be perpendicular to the nozzle body 9. The nozzle body 9 is positioned at an upper side of the space 10. The nozzle body 9 has an arc-shaped distribution surface 9a at an end thereof so that the cleaning medium injected through a nozzle hole 9b of the nozzle body 9 is injected into a lower portion of the injection space 10. Therefore, the cleaning medium injected from the nozzle body 9 is dashed on the distribution surface 9a, and thus injected at an angle of about 146° into the lower portion of the injection space 10. In order to obtain such injection angle of the cleaning medium, the distribution surface 9a has an angle of about 75° with respect to the distribution surface 9a.

As shown in drawing, the first venturi block 3 is connected to the base block 1 and the sub-block 2. The first venturi block 3 has multiple, preferably, 10 or more venturi paths 15 disposed in parallel and multiple cleaning medium injection paths 16 for connecting each throttle portion of the venturi path 15 to the injection space 10 of the sub-block 2, such that the cleaning medium injection paths 16 are adjacent to the throttle portion of the venturi paths 15. The venturi paths 15 are connected with the space 6 formed in the base block 1. The carrier gas supplied from the space 6 formed in the base block 1 is adiabatically expanded and a flow rate of the carrier gas is increased, while the carrier gas passes through a throttle portion of the venturi path 15. Therefore, in the venturi path 15, the cleaning medium supplied from the sub-block 2 through the cleaning medium injection path 16 to the venturi path 15 can be rapidly mixed with the carrier gas supplied from the base block 1 to the venturi path 15.

Each of the cleaning medium injection paths 16 has an angle of 15° to 60°, preferably 45° with respect to each of the venturi paths 15. The venturi paths 15 respectively have a diameter of about 2 mm at a place where the venturi paths 15 are contacted with the cleaning medium injection paths 16. The throttle portion formed in the venturi path 15 has a diameter of about 0.3 to 1 mm. An inlet and an outlet of the venturi path 15 respectively have a diameter of 1 to 3 mm. However, it is preferable that the diameter of the outlet is smaller than that of the inlet. In addition, since the cleaning medium injection paths 16 respectively have the above-mentioned angle with respect to the venturi paths 15 and the pressure of the carrier gas is about 10 to 50 psi lower than that of the cleaning medium of liquid Co2 state, a clogging phenomenon of the pipe due to back pressure or solidified particles is prevented.

Meanwhile, the carrier gas can be uniformly supplied to the venturi paths 15 formed in the first venturi block 3 according to a structure of the slit 7a of the nozzle body 7 disposed in base block ion solution, and the cleaning medium can be uniformly supplied to the cleaning medium supplying path 16 according to a structure of the distribution surface 9a and the space 10 of the nozzle body 9. The cleaning medium is adiabatically expanded while passing through the venturi paths 15 of the first venturi block 3, and the carrier gas has the increased flow rate after passing through the throttle portion, whereby a mixing rate of the carrier gas and the cleaning medium is increased. Preferably, the cleaning medium path 16 has a larger diameter of an upper portion thereof than that of a lower portion thereof, and the diameter of the lower portion is 0.1 to 0.3 mm. Therefore, the snow solidification of the cleaning medium is improved.

The intermediate block 5 is connected to the first venturi block 3. The intermediate block 5 has a mixing space 18 and a path 19 communicated with a venturi path 17 of the second venturi block 4. The mixing space 18 secures the sure mixing of the cleaning medium and the carrier gas and also stabilizes the flow of the cleaning medium and the carrier gas so as to induce the growth of the snow particles. In the mixing space 18, a turbulent flow is stably transformed into a laminar flow, while the carrier gas and the cleaning medium are completely mixed and, at the same time, the snow particles are grown, thereby maintaining the uniform injection conditions. Preferably, each of the paths 19 has the same diameter as an inlet of the venturi path 15.

The second venturi block 4 has the same number of venturi paths 17 as the number of venturi paths 15 of the first venturi block 3 and the number of the paths of the intermediate block 5. The second venturi block 4 is connected to the intermediate block 5 so that the venturi paths 17 are exactly met with each other. As described above, since there are provided 10 or more venturi paths 17 of the second venturi block 4 through which the mixture of the cleaning medium and the carrier gas is injected into the outside, the nozzle of the present invention has an increased injection surface area.

The mixed gas of the cleaning medium and the carrier gas, of which the snow particles are grown, is adiabatically expanded again, while passing through the venturi paths 17 of the second venturi block 4. Thus, a size of the sublimable solid particle can be maximized.

Meanwhile, in the embodiment of the present invention, as described above, the intermediate block 5 is disposed between the first venturi block 3 and the second venturi block 4. Further, since the diameter of the cleaning medium path 16 through which the cleaning medium of the liquid $Co_2$ state is passed is reduced, the pressure of the cleaning medium, which is higher than the supplying pressure of the carrier gas, is applied to the cleaning medium path, thereby solving the problem of back pressure. Furthermore, since a proper amount of snow particles are formed, it is possible to inject the cleaning medium with the low pressure carrier gas.

As described above, the mixing places of the paths 15, 16, 17 and 19 formed in the first and second venturi block 3 and 4 and the intermediate block 5 respectively have a diameter of 2 mm. The throttle portion of each venturi path 15 and 17 has a diameter of 0.3 to 1 mm. The cleaning medium path 16 has a diameter of 0.1 to 0.3 mm. The inlet and outlet have a diameter of 1 to 3 mm.

According to the nozzle of the present invention, at the place in which the cleaning medium and the carrier gas are mixed, the cleaning medium supplying paths have an acute angle with respect to the venturi paths. The clogging of the cleaning medium supplying path due to the backflow of the carrier gas is prevented by pressure gradient according to a size of the cleaning medium path.

In addition, due to the first and second venturi blocks and the intermediate block, the flow and the solidified particles of the cleaning medium are stabilized and the solidification rate is maximized. Therefore, the consumption of the cleaning medium can be reduced, while a time of cleaning process can be remarkably reduced by the increasing in the injection surface area of the nozzle.

INDUSTRIAL APPLICABILITY

As described above, the cleaning medium is transformed into the liquid $Co_2$ by the first decompression using the regulator and other valve and the temperature drop using the cryogenic heat exchanger. The liquid $Co_2$ is phase-changed to form the sublimable solid particles like the $Co_2$ particles, while passing through the cleaning medium path 16. Further, while the cleaning medium is passed through the nozzle of the present invention, an opportunity of the adiabatic expansion of the cleaning medium is maximized, and the flow rate of the cleaning medium is increased by the carrier gas. Meanwhile, in the embodiment, the $Co_2$ is used as the cleaning medium. However, it is obvious to those skilled in the art that other medium like $Ar^+$ can be used as the cleaning medium.

What is claimed is:

1. A nozzle for injecting sublimable solid particles entrained in gas for cleaning a surface, comprising:
   a base block having a space in which carrier gas is supplied through a gas supplying pipe;
   a sub-block having a space in which cleaning medium decompressed by a regulator is supplied through a cleaning medium supplying pipe;

a first venturi block having a venturi path for adiabatically expanding the carrier gas supplied from the space of the base block, and a cleaning medium injection path is adjacent to a throttle portion so as to connect the throttle portion of the venturi path with the space of the sub-block to mix the cleaning medium of the sub-block and the carrier gas passed through the venturi path;

a second venturi block having a venturi path for adiabatically expanding the mixed gas of the carrier gas and the cleaning medium, wherein the venturi path of the first venturi block has an acute angle with respect to the cleaning medium injection path, and wherein the first and second venturi blocks respectively have a plurality of venturi paths disposed in parallel, and the sub-block has the same number of cleaning injection paths as the number of venturi paths.

2. The nozzle of claim 1, further comprising an intermediate block having a path, which is disposed between the first and second venturi blocks, for promoting the mixture of the carrier gas and the cleaning medium in the mixed gas moving from the path of the first venturi block to the path of the second venturi block and thus inducing growth of snow particles.

3. The nozzle of claim 1, wherein the venturi path of the first venturi block has an angle of 15 to 60° with respect to the cleaning medium injection path.

4. The nozzle of claim 1, wherein the carrier gas supplying pipe has a slit at an end thereof so that the carrier gas is injected at a desired angle range when supplied to the space of the base block.

5. The nozzle of claim 4, wherein the carrier gas injected through the slit has an angle of 116°.

6. The nozze of claim 1, wherein the cleaning medium supplied to the first venturi path has a pressure of 10 to 50 psi, and the carrier supplied to the space of the base block has a pressure of 60 to 100 psi.

7. The nozzle of claim 1, wherein the cleaning medium is $CO_2^+$ or $Ar^+$.

8. The nozzle of claim 1, wherein the carrier gas is $N_2$ gas or clean dry air.

* * * * *